United States Patent
Tang et al.

(10) Patent No.: US 8,811,013 B2
(45) Date of Patent: Aug. 19, 2014

(54) MOUNTING APPARATUS FOR FAN

(75) Inventors: Xian-Xiu Tang, Shenzhen (CN); Zhen-Xing Ye, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 1031 days.

(21) Appl. No.: 12/831,297

(22) Filed: Jul. 7, 2010

(65) Prior Publication Data

US 2011/0241506 A1 Oct. 6, 2011

(30) Foreign Application Priority Data

Apr. 1, 2010 (CN) .......................... 2010 1 0137198

(51) Int. Cl.
*H05K 7/20* (2006.01)

(52) U.S. Cl.
USPC ...... 361/695; 454/184; 415/213.1; 415/214.1

(58) Field of Classification Search
USPC .............. 454/184; 361/695; 415/213.1, 214.1
See application file for complete search history.

(56) References Cited

U.S. PATENT DOCUMENTS

| | | | |
|---|---|---|---|
| 6,556,437 B1 * | 4/2003 | Hardin | 361/679.48 |
| 6,592,449 B2 * | 7/2003 | Cipolla et al. | 454/184 |
| 7,465,151 B2 * | 12/2008 | Hong et al. | 415/119 |
| 2005/0227608 A1 * | 10/2005 | Wu et al. | 454/184 |
| 2007/0003413 A1 * | 1/2007 | Hsu et al. | 415/199.5 |
| 2007/0053159 A1 * | 3/2007 | Crippen et al. | 361/695 |
| 2008/0286100 A1 * | 11/2008 | Hu et al. | 415/214.1 |
| 2009/0009961 A1 * | 1/2009 | Li | 361/687 |

* cited by examiner

*Primary Examiner* — Eric Keasel
*Assistant Examiner* — Ian Paquette
(74) *Attorney, Agent, or Firm* — Novak Druce Connolly Bove + Quigg LLP

(57) ABSTRACT

A mounting apparatus includes a case. The case includes a first bracket and a second bracket. The first bracket defines a space. The second bracket is configured for securing a fan and is connected with the first bracket. The second bracket has a volume equal to or less than the volume of the first bracket space.

7 Claims, 5 Drawing Sheets

MOUNTING APPARATUS FOR FAN

BACKGROUND

1. Technical Field

The present disclosure relates to a mounting apparatus for securing a fan.

2. Description of Related Art

Fans are used in server systems and computer systems for cooling electronic elements. For example, one fan is used to cool a CPU, and two fans are used to cool a hard disk drive. However, if the CPU needs two fans to cool it, and the hard disk drive needs three fans to cool it, different mounting methods are needed.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
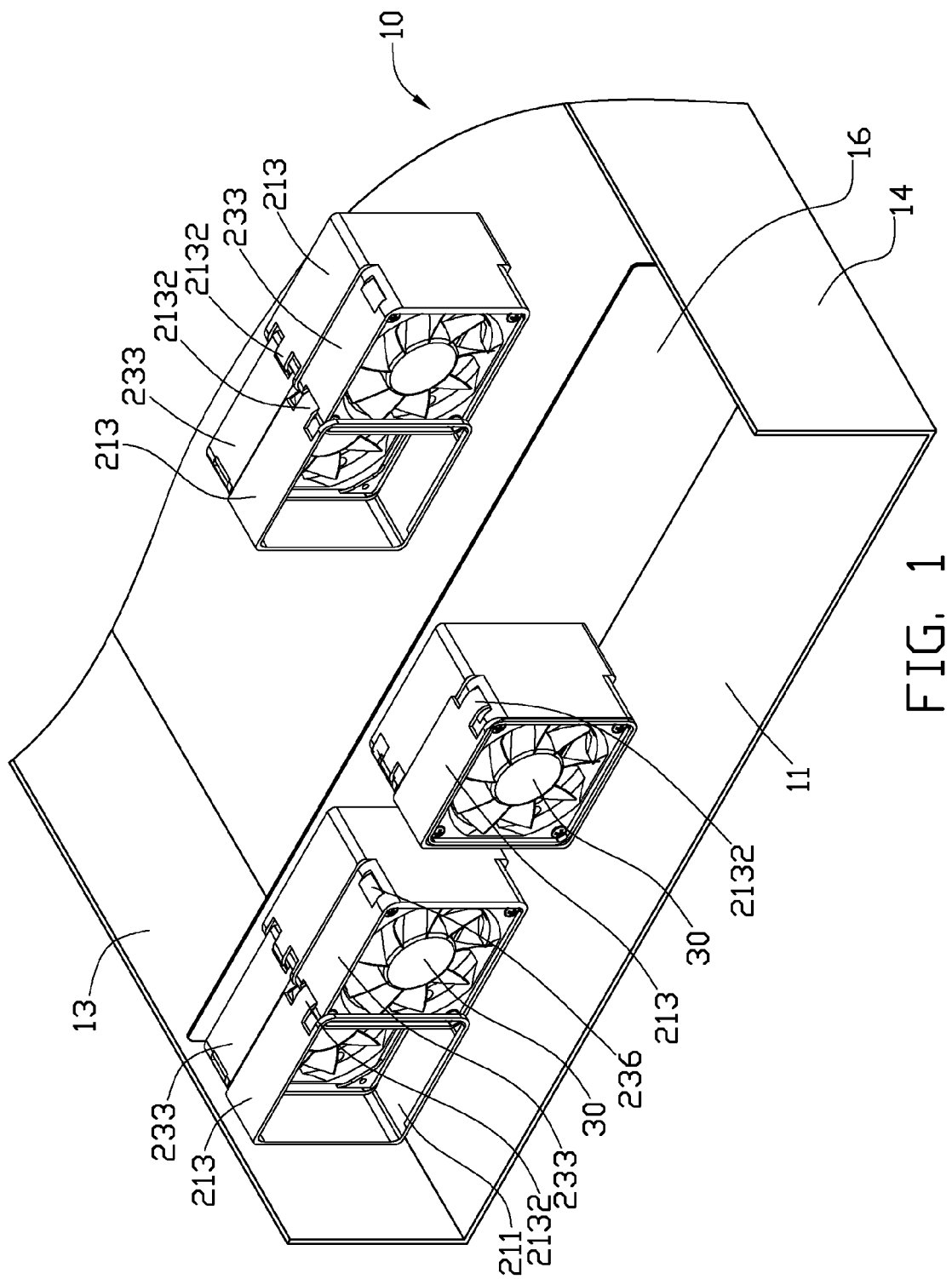
FIG. 1 is a partially exploded view of a plurality of cases, an electronic device chassis and a plurality of fans in accordance with one embodiment.

Referring to FIG. 1, a mounting apparatus in accordance with one embodiment includes two cases 20 each configured to secure a fan 30 to an electronic device chassis 10, such as a computer system chassis or a server chassis. The electronic device chassis 10 includes a chassis bottom plate 11, a first chassis side plate 13, and a second chassis side plate 14. The first and second chassis side plates 13, 14 are located on the chassis bottom plate 11 and substantially parallel to each other. A mounting plate 16 is secured on the chassis bottom plate 11 between the first and second chassis side plates 13, 14. A plurality of ventilation holes (not shown) is defined in the mounting plate 16.

Figure 2:
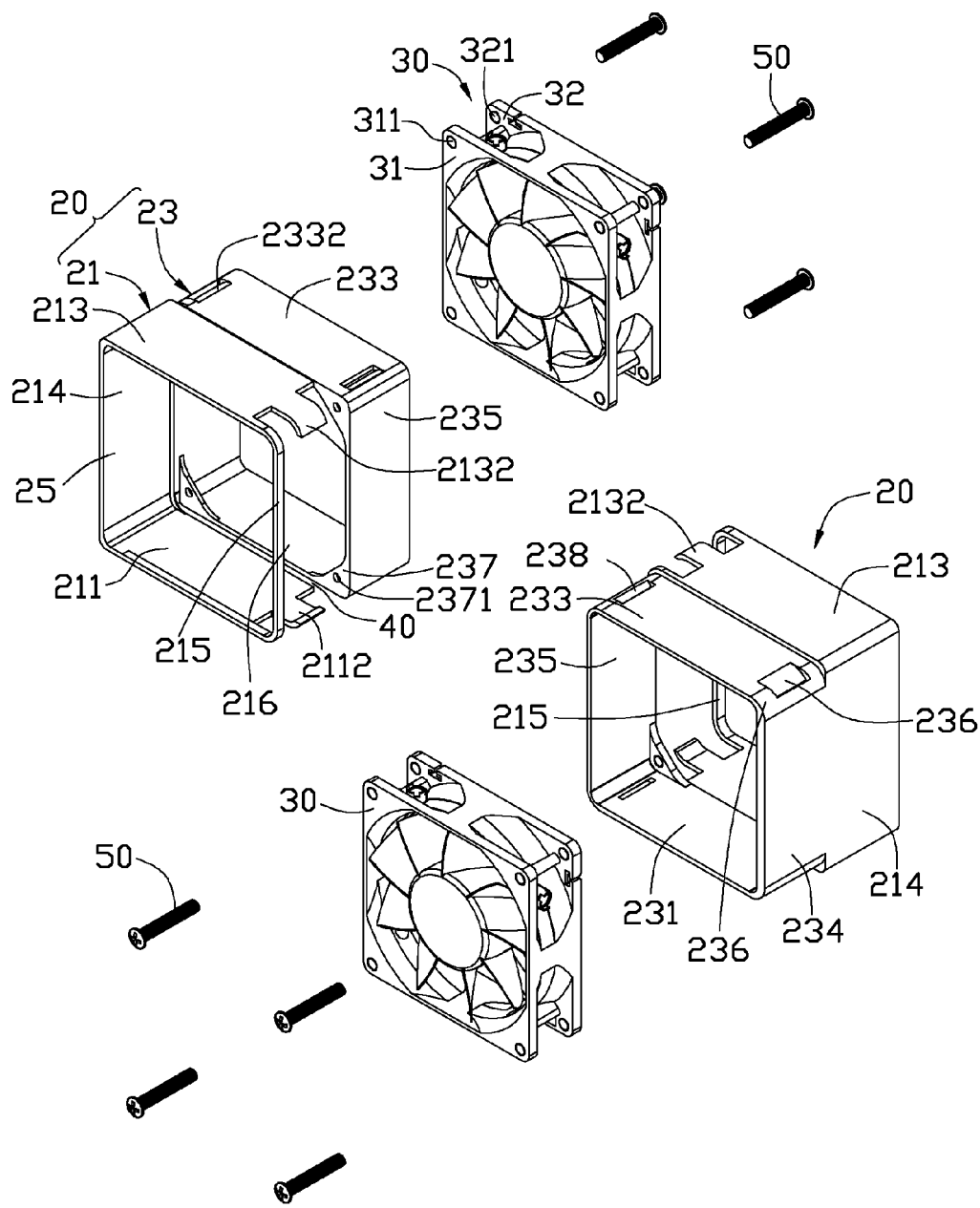
FIG. 2 is an exploded view of two cases and two fans of FIG. 1.

Referring to FIGS. 1-2, each case 20 includes a first bracket 21 and a second bracket 23 connecting with the first bracket 21. The first bracket 21 of one case 20 is configured to receive the second bracket 23 of another case 20.

The first bracket 21 includes a bottom wall 211, a top wall 213, a first sidewall 214 and a second sidewall 215. The first and second sidewalls 214, 215 are connected between the bottom wall 211 and the top wall 213, and a space 25 is enclosed by the bottom wall 211, a top wall 213, and the first and second sidewalls 214, 215. A through opening 216 is defined in the second sidewall 215. A first tongue 2112 extends from the bottom wall 211 into the through opening 216, and a second tongue 2132 extends from the top wall 213 into the through opening 216. The first and second tongue 2112, 2132 are resiliently deformable.

The second bracket 23 includes a bottom plate 231, a top plate 233, a first side plate 234, and a second side plate 235. The first and second side plates 234, 235 are connected between the bottom plate 231 and the top plate 233. A first slot 236 and a second slot 238 are defined in each of the bottom plate 231 and the top plate 233. In one embodiment, the first slot 236 extends to each of the joints between the first side plate 234 and the bottom plate 231 and between the first side plate 234 and the top plate 233. The second slot 238 extends to each of joints between the second plate 235 and the bottom plate 231 and between the second side plate 235 and the top plate 233. Four retaining pieces 237 are disposed on four corners in the second bracket 23. Each retaining piece 237 defines a mounting hole 2371. A gap 40 is defined between the bottom wall 211 and the bottom plate 231 and between the top wall 213 and the top plate 233. The first side wall 214 and the first side plate 234 are connected together. In one embodiment, the first bracket 21 is integrated with the second bracket 23.

The second bracket 23 has a volume substantially equal to or smaller than the volume of the space 25. The through opening 216 of the first bracket 21 has a length along a direction perpendicular to the bottom wall 211 greater than a length of the second bracket 23 along a direction perpendicular to the bottom plate 231, and a width along a direction parallel to the bottom wall 211 greater than a width of the second bracket 23 along a direction parallel to the bottom plate 231.

A fan 30 is configured to be received in the second plate 235 and includes a first fan wall 31 and a second fan wall 32 opposite to the first wall 31. The first fan wall 31 defines four first through holes 311, and the second fan wall 32 defines four second through holes 321. The first and second through holes 311, 321 correspond to the mounting holes 2371 of the retaining pieces 237.

Figure 3:
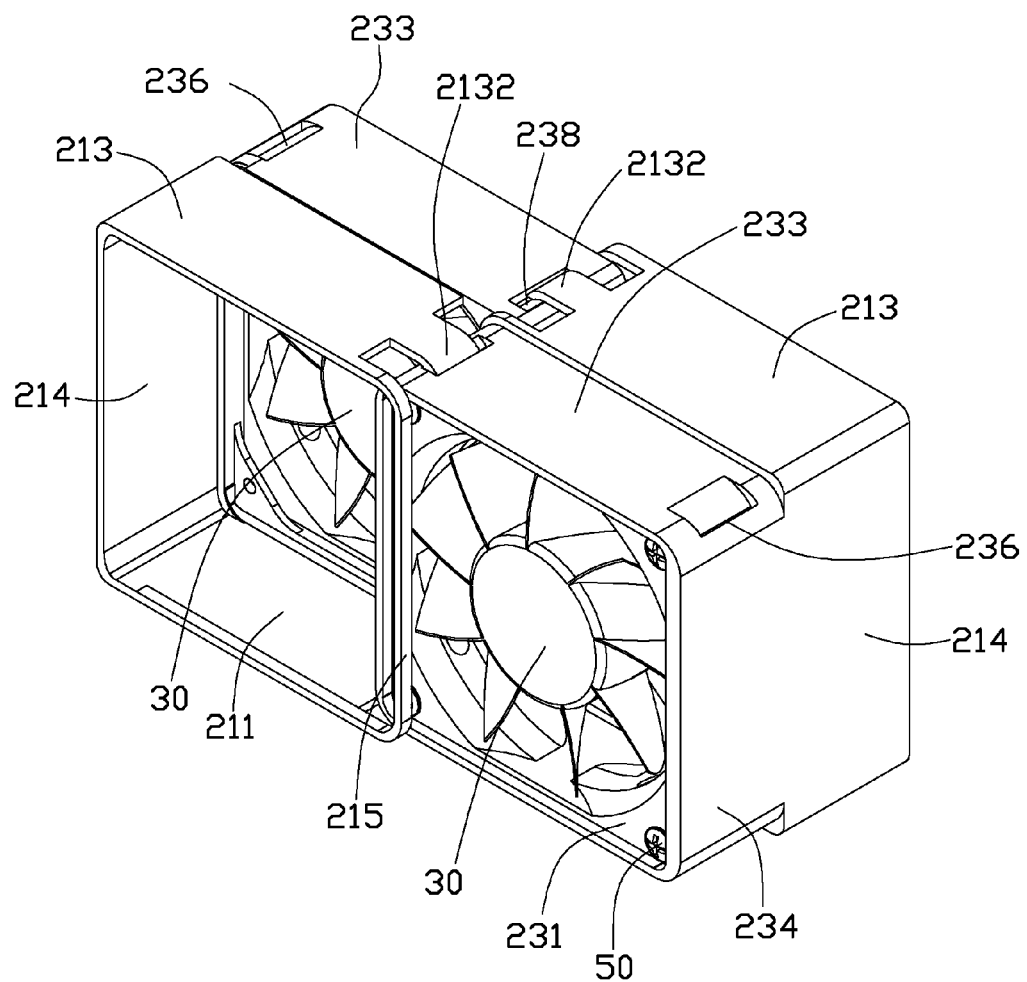
FIG. 3 is an assembled view of the two cases and the two fans of FIG. 2.

Referring to FIGS. 2-3, the fan 30 is secured in the second bracket 23 with four fasteners 50, such as screws, secured into the first and second through holes 311, 321 and the mounting holes 2371.

In one embodiment, a portion of the second bracket 23 of a first case 20 is inserted into the first bracket 21 of a second case 20 through the opening 216, and a portion of the second bracket 23 of the second case 20 is inserted into the first bracket 21 of the first case 20 through the opening 216. The first and second tongues 2112, 2132 of the second case 20 are engaged into the second slots 238 of the first case 20, and the first and second tongues 2112, 2132 of the first case 20 are engaged into the second slots 238 of the second case 20. Therefore, the first case 20 is secured to the second case 20 at one side.

Figure 4:
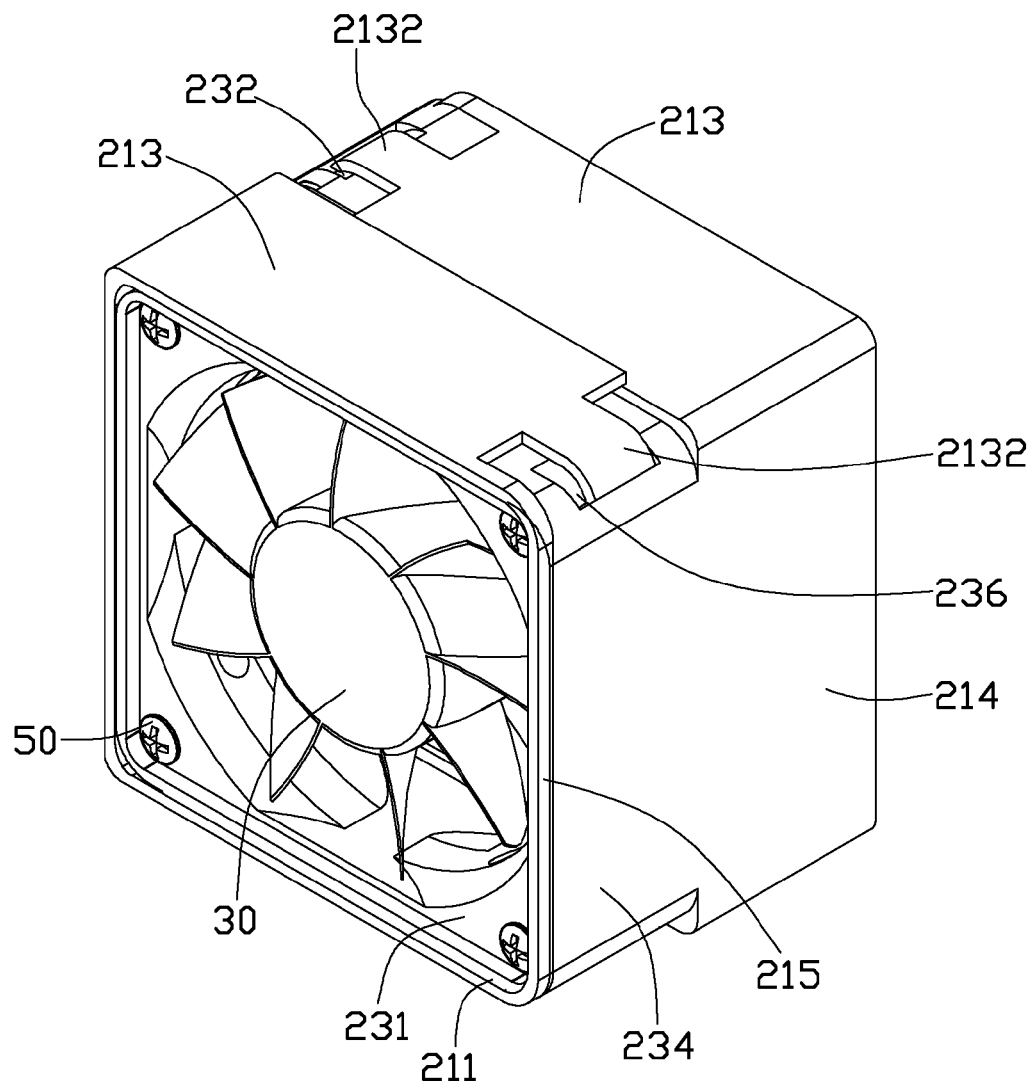
FIG. 4 is another assembled view of FIG. 3.

Referring to FIG. 4, in another embodiment, the second bracket 23 of a first case 20 is inserted into the first bracket 21 of a second case 20 through the opening 216, and the second bracket 23 of the second case 20 is inserted into the first bracket 21 of the first case 20 through the opening 216. The first and second tongues 2112, 2132 of the second case 20 are engaged into the first slots 236 of the first case 20, and the first and second tongues 2112, 2132 of the first case 20 are engaged into the first slots 236 of the second case 20. Therefore, the first case 20 is secured to and enclosed by the second case 20.

Figure 5:
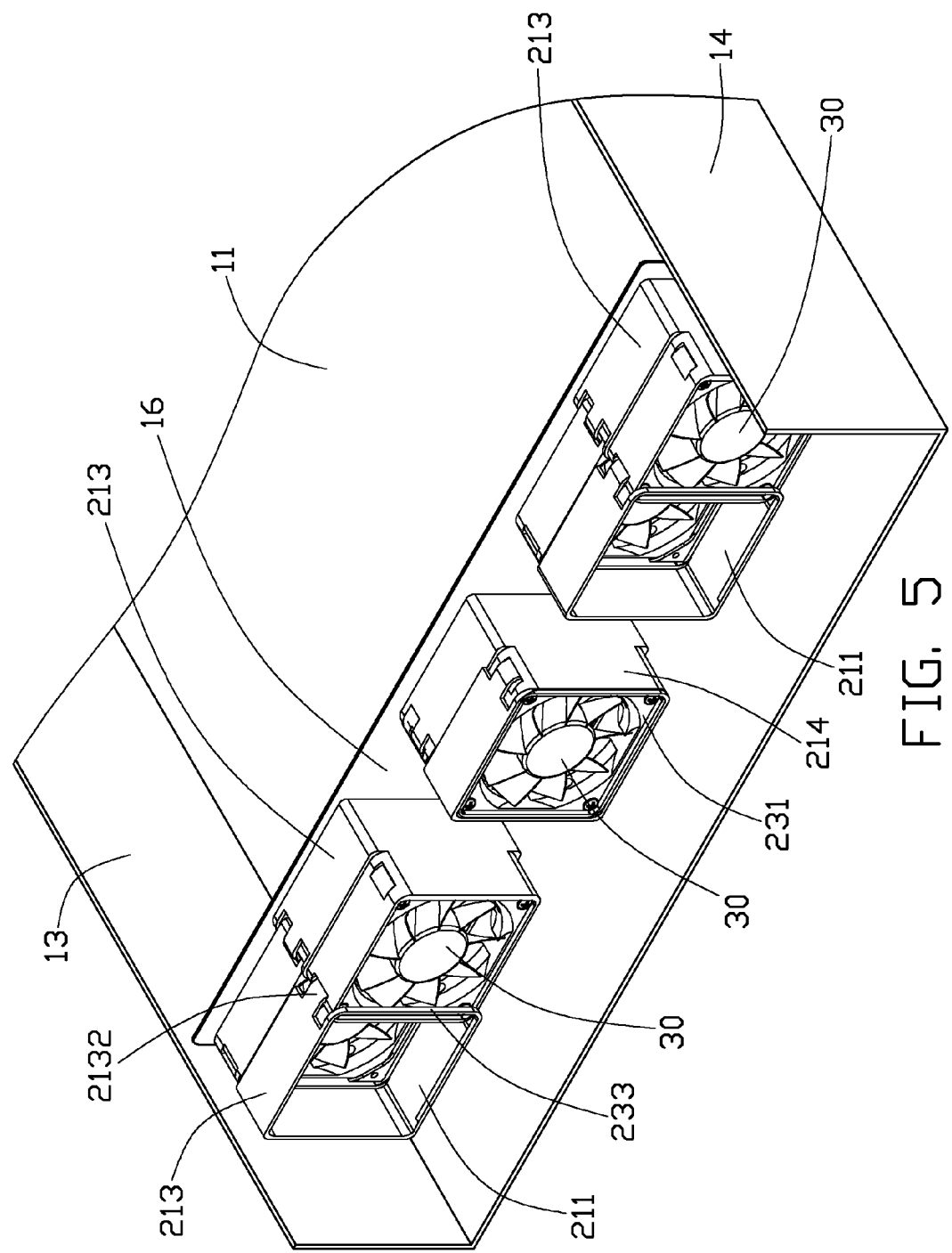
FIG. 5 is an assembled view of FIG. 1.

Referring to FIG. 5, a plurality of fans 30 are respectively attached to the second brackets 23 of a plurality of cases 20, and then secured to the mounting plate 16 of the electronic device chassis 10, corresponding to the ventilation holes.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus comprising:
   two cases, each of the two cases comprising:
   a first bracket of each case defining a space and a through opening communicating with the space; and
   a second bracket configured for securing a fan, the second bracket being integrated with the first bracket;
   wherein the second bracket of one case extends through the through opening of the first bracket of another case and is received in the space of the first bracket of another case;
   the first bracket of each case comprises a bottom wall, a top wall, a first sidewall, and a second sidewall; the first and second sidewalls are connected between the bottom wall and the top wall, and the space is enclosed by the bottom wall, the top wall, and the first and seconds sidewalls; and
   two tongues extend from the bottom wall and the top wall respectively into the through opening.

2. The mounting apparatus of claim 1, wherein the second bracket of each case comprises a bottom plate, a top plate, a first side plate, and a second side plate; the first and second side plates are located between the bottom plate and the top plate; and the top plate is adjacent the top wall, and the bottom plate is adjacent the bottom wall.

3. The mounting apparatus of claim 2, wherein the bottom plate and the top plate defines two slots; and the two slots of the bottom plate and the top plate are shaped to fit the two tongues.

4. The mounting apparatus of claim 2, wherein a plurality of retaining pieces is located in the second bracket and configured for securing the fan.

5. A mounting apparatus comprising:
   an electronic device chassis; and
   a case secured to the electronic device chassis, the case comprising:
   a first bracket defining a space and a through opening communicating with the space; and
   a second bracket configured for securing a fan, the second bracket being connected with the first bracket;
   wherein a gap is defined between the first bracket and the second bracket, and the first bracket is shaped to fit the second bracket, and the through opening is shaped to fit the second bracket being inserted therethrough to be received in the space;
   the first bracket comprises a bottom wall, a top wall, a first sidewall, and a second sidewall; the first and second sidewalls are connected between the bottom wall and the top wall, and the space is enclosed by the bottom wall, the top wall, the first sidewall, and the second sidewall; and
   a tongue extends from one of the bottom wall and the top wall into the through opening.

6. The mounting apparatus of claim 5, wherein the second bracket comprises a bottom plate, a top plate, a first side plate, and a second side plate; the first and second side plates are located between the bottom plate and the top plate; and the top plate is adjacent the top wall, and the bottom plate is adjacent the bottom wall; and one of the bottom plate and the top plate defines a slot; and the slot is shaped to fit the tongue.

7. The mounting apparatus of claim 6, wherein a plurality of retaining pieces is located in the second bracket and configured for securing the fan.

* * * * *